United States Patent [19]
Wolf

[11] Patent Number: 5,379,912
[45] Date of Patent: Jan. 10, 1995

[54] CONNECTING ARRANGEMENT FOR A COVER PANEL

[75] Inventor: Thomas Wolf, Stuttgart, Germany

[73] Assignee: Dr. Inc. h.c.F. Porsche AG, Germany

[21] Appl. No.: 116,757

[22] Filed: Sep. 7, 1993

[30] Foreign Application Priority Data

Sep. 5, 1992 [DE] Germany .............. 4229718

[51] Int. Cl.⁶ .................................. B65D 25/24
[52] U.S. Cl. ...................... 220/481; 220/241; 220/326; 220/328; 220/329; 220/346; 220/378
[58] Field of Search ............. 220/200, 241, 252, 315, 220/324, 326, 328, 329, 345, 346, 306, 378, 480, 481, 3.8

[56] References Cited

U.S. PATENT DOCUMENTS

| | | | |
|---|---|---|---|
| 2,695,434 | 11/1954 | Bedford . | |
| 2,811,768 | 11/1957 | Axelson | 220/306 X |
| 3,031,049 | 4/1962 | Somville . | |
| 3,197,549 | 7/1965 | Good | 220/241 X |
| 3,259,410 | 7/1966 | Neudecker et al. | 220/315 X |
| 3,394,838 | 7/1968 | Larkin | 220/326 |
| 3,572,413 | 3/1971 | Livingstone | 220/386 |
| 4,110,549 | 8/1978 | Goetzke et al. . | |
| 4,664,281 | 5/1987 | Falk et al. | 220/378 X |
| 4,699,293 | 10/1987 | Duchrow | 220/378 |
| 4,708,245 | 11/1987 | Boeckmann et al. | 206/330 |
| 4,733,778 | 3/1988 | Boeckmann et al. | 206/332 |
| 4,984,798 | 1/1991 | Silberstein | 220/326 X |

FOREIGN PATENT DOCUMENTS

| | | |
|---|---|---|
| 1891222 | 4/1964 | Germany . |
| 2456802 | 6/1976 | Germany . |
| 2633702 | 2/1978 | Germany . |
| 3626926 | 2/1988 | Germany . |
| 3932593 | 4/1991 | Germany . |

Primary Examiner—Gary E. Elkins
Assistant Examiner—Stephen Cronin
Attorney, Agent, or Firm—Evenson, McKeown, Edwards & Lenahan

[57] ABSTRACT

An arrangement for connecting a cover panel for an electrical apparatus with a body structure, particularly of a vehicle, has locking bolts. On the interior side of its bottom, the cover panel is provided with locking rails into which, for the fastening of the panel, snap-in heads of bolts connected with the body structure can be inserted in a clamping manner. For removal, the panel is arranged so than it can be slid longitudinally on the snap-in heads that are held in the rails.

4 Claims, 2 Drawing Sheets

CONNECTING ARRANGEMENT FOR A COVER PANEL

BACKGROUND AND SUMMARY OF THE INVENTION

The present invention relates to an arrangement for connecting a cover panel for an electrical apparatus with a body structure, particularly of a vehicle, by locking bolts.

From German Patent Document 39 32 593 A1, it is known to connect frame parts by locking bolts, in which case the locking bolt is provided on one frame part and a sleeve is provided in another frame part in which the locking bolt is held in a clamping manner. These are pulled apart for the separating of the frame parts from one another.

It is an object of the invention to provide a connecting arrangement for a cover panel on a body wall of a vehicle which is secured despite strong vibrations and which cannot be dismounted in the mounting direction.

This and other objects are achieved by the present invention which provides an arrangement for connecting a cover panel for an electrical apparatus with a body structure of a vehicle by locking bolts, and comprises a cover panel that has an interior bottom side with locking rails, and bolts having snap-in heads, the bolts being connected with the body structure and clampingly insertable into the locking rails to thereby fix the cover panel while allowing the cover panel to be slid longitudinally off the snap-in heads to remove the cover panel.

Some of the principal advantages achieved by the present invention are that, for the purpose of being fastened on the body wall, the cover panel is pressed onto locking bolts, in which case interior locking rails hold the panel in the manner of a snap connection. A pulling-off of the cover panel in the mounting direction is not possible because of the construction of the snap connection (bolt/locking rail). This ensures that a falling-off of the cover panel as a result of vibrations during the driving operation is prevented.

In certain embodiments, the locking rails are molded to the cover panel which consists of plastic and extend in parallel to the wall and are arranged so that they are aligned behind one another.

For the pressing of the snap-in head between the walls of the locking rail, these are constructed so that they can be bent apart elastically.

On the face side, the snap-in head of the bolt is constructed in the shape of a hemisphere and reaches by means of its rearward holding surface behind a narrowed insertion opening in the locking rail. In the area of the opening, this locking rail has locking strips on each edge which cause the narrowing.

By way of a thread part, the bolt is at the same time used for the fastening of the electric device which is to be covered in a sealing manner, for the purpose of which it is fastened on the body wall by means of a nut or the like.

The watertight sealing-off of the cover panel with respect to the body wall is achieved by means of a surrounding gasket cord which is provided in a groove-shaped recess in the edge of the panel.

Other objects, advantages and novel features of the present invention will become apparent from the following detailed description of the invention when considered in conjunction with the accompanying drawings.

DETAILED DESCRIPTION OF THE DRAWINGS

Figure 3:
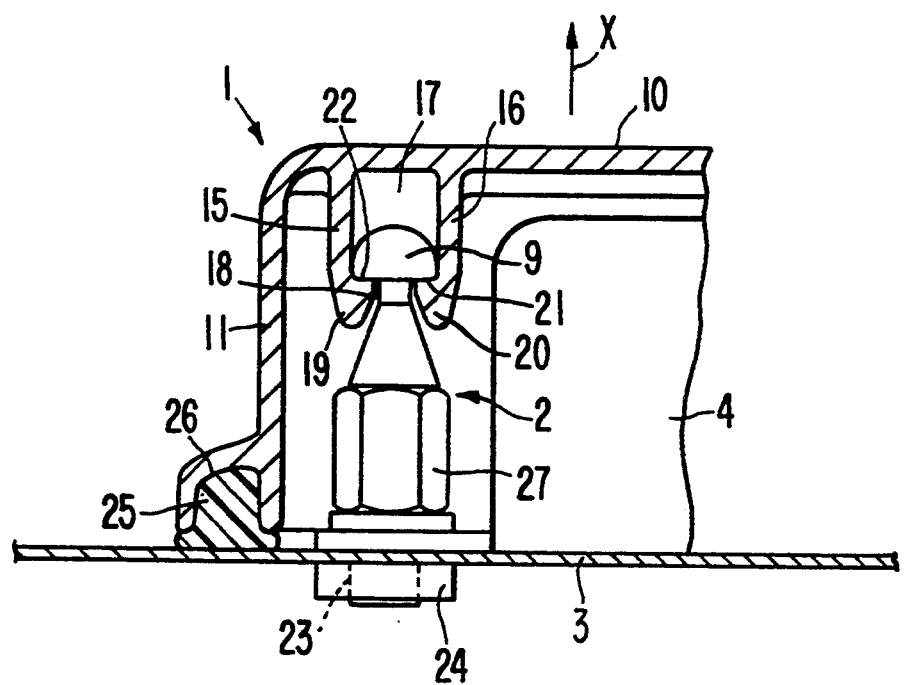
FIG. 3 is a sectional view of a cover panel with an enlarged view of the connection by way of a locking bolt on a body wall.

FIG. 3 shows a cover panel 1 that is connected with a body wall 3 by locking bolts 2. An electrical apparatus 4, such as an ABS-control unit, is enclosed by the panel 1 in a watertight manner.

Figure 1:
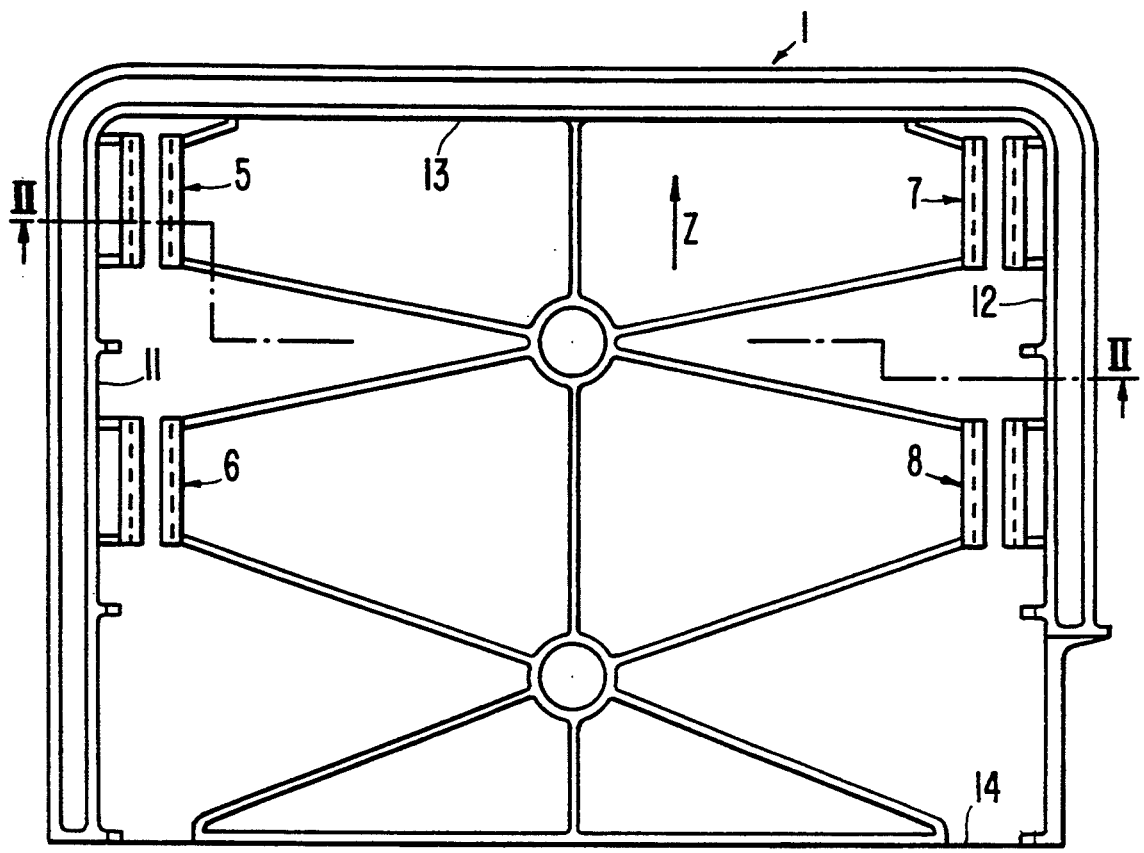
FIG. 1 is a top view of a cover panel from the interior, constructed in accordance with an embodiment of the present invention.
Figure 2:
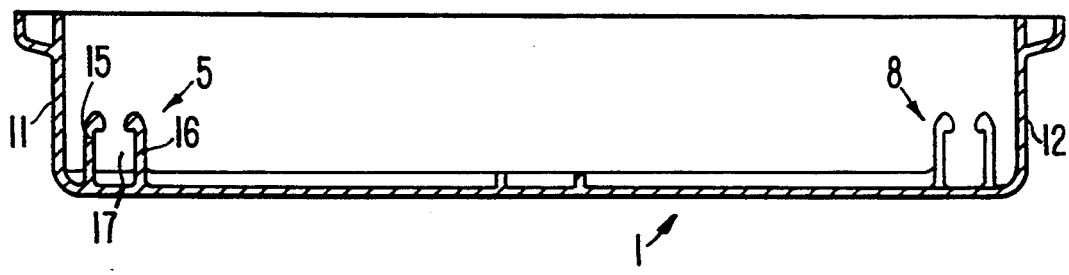
FIG. 2 is a sectional view according to Line II—II of FIG. 1.

As seen in FIGS. 1-3, the cover panel 1 has locking rails 5, 6, 7 and 8 which are molded to the interior side of the bottom 10. Snap-in heads 9 of the bolts 2 are form-lockingly held in these locking rails 5, 6, 7 and 8 in the maimer of a snap.

The locking rails 5, 6 and 7, 8 are each arranged adjacent to the side walls 11, 12. The locking rails 5, 6 and 7, 8 extend in parallel to these walls 11, 12 and are respectively aligned behind one another. Likewise, the locking rails 5, 6, 7 and 8 may also be arranged in parallel to the longitudinal walls 13 and 14.

The locking rail has two elastically springy walls 15 and 16 which form between one another a receiving space 17 for the snap-in head 9 of the bolt 2. The receiving space 17 is provided with a narrowed insertion opening 18 that has locking strips 19, 20 on the free edges of the wails 15, 16. These locking strips 19, 20 have interior contact surfaces 21 which cause the narrowing and against which a surrounding holding surface 22 of the snap-in head 9 will be placed.

On its end facing away from the snap-in head 9, the bolt 2 is provided with a threaded part 23 which is fastened in a nut 24 or the like on the body wall 3. For handling, a hexagon 27 is provided between the snap-in head 9 and the threaded part 23. The electrical apparatus 4 will be firmly connected with the body wall 3 by this threaded part 23.

For the watertight sealing-off of the panel 1 with respect to the body wall 3, a gasket cord 25 is used. This gasket cord 25 is embedded in a surrounding groove 26 in the surrounding edge of the walls of the cover panel 1.

A placing of the panel I over the electrical apparatus 4 takes place in such a mariner that the bolts 2 are fastened on the body wall 3 in a corresponding position, as indicated by FIG. 3. The panel 1 is pressed onto the snap-in heads 9 in the axial direction of the bolts 2 so that the snap-in heads 9 engage between the walls 15, 16 of the locking rails 5 to 8. For the removal of the panel 1, it is slid in the direction of the arrow Z (FIG. 1), that is, at a right angle with respect to the axial direction of the bolt 2, since a pulling-off in the direction of the arrow X (FIG. 3) is not possible because of the firm connection by the snap-in heads 9 in this direction.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. An arrangement for connecting a cover panel for an electrical apparatus with a body structure of a vehicle by locking bolts, comprising:
   a cover panel that has a bottom wall, two opposing side walls and at least two locking rails attached to an interior side of said bottom wall; and
   bolts having snap-in heads, the bolts being connected with the body structure and clampingly insertable into the locking rails to thereby fix the cover panel while allowing the cover panel to be slid longitudinally off the snap-in heads to remove the cover panel;
   wherein said at least two locking rails are arranged adjacent to each of said opposing side walls of the cover panel, said two locking rails extending in parallel to said side walls and aligned behind one another;
   wherein the locking rails have two elastically bendable walls that are parallel to one another and form between one another a receiving space for the snap-in head, wherein the receiving space has a narrowed insertion opening which is directed to the bolt.

2. An arrangement according to claim 1, wherein the insertion opening includes narrowing locking strips on the edges of the bendable walls, the locking strips being hook-shaped. the head, when pressed in from the outside reaching behind the locking strips in a holding manner.

3. An arrangement according to claim 2, wherein the snap-in head has a hemispherically-shaped face side and rear holding surfaces for resting against opposite interior contact surfaces of the locking strip.

4. An arrangement according to claim 1, wherein the bolt has a threaded part which faces away from the snap-in head for fastening the electrical apparatus on the body structure, and a hexagon between the snap-in head and the threaded part, said hexagon providing a handle.

* * * * *